United States Patent
Cauley et al.

(10) Patent No.: US 10,408,910 B2
(45) Date of Patent: Sep. 10, 2019

(54) SYSTEMS AND METHODS FOR JOINT TRAJECTORY AND PARALLEL MAGNETIC RESONANCE IMAGING OPTIMIZATION FOR AUTO-CALIBRATED IMAGE RECONSTRUCTION

(71) Applicant: THE GENERAL HOSPITAL CORPORATION, Boston, MA (US)

(72) Inventors: Stephen Cauley, Cambridge, MA (US); Kawin Setsompop, Cambridge, MA (US); Lawrence L Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 305 days.

(21) Appl. No.: 15/281,457

(22) Filed: Sep. 30, 2016

(65) Prior Publication Data
US 2017/0097403 A1   Apr. 6, 2017

Related U.S. Application Data

(60) Provisional application No. 62/235,738, filed on Oct. 1, 2015.

(51) Int. Cl.
| | |
|---|---|
| *G01V 3/00* | (2006.01) |
| *G01R 33/58* | (2006.01) |
| *G01R 33/48* | (2006.01) |
| *G01R 33/561* | (2006.01) |
| *G01R 33/567* | (2006.01) |
| *G01R 33/565* | (2006.01) |

(52) U.S. Cl.
CPC ....... *G01R 33/583* (2013.01); *G01R 33/4818* (2013.01); *G01R 33/4826* (2013.01); *G01R 33/5616* (2013.01); *G01R 33/5673* (2013.01); *G01R 33/4824* (2013.01); *G01R 33/5611* (2013.01); *G01R 33/56545* (2013.01)

(58) Field of Classification Search
CPC ...................................................... G01R 33/583
USPC .................................................. 324/309, 307
See application file for complete search history.

(56) References Cited

U.S. PATENT DOCUMENTS

| | | | |
|---|---|---|---|
| 7,888,935 B1 * | 2/2011 | Tan ................. | G01R 33/56572 324/307 |
| 8,981,776 B2 | 3/2015 | Setsompop et al. | |
| 9,417,306 B2 * | 8/2016 | Griswold ........... | G01R 33/5611 |

(Continued)

OTHER PUBLICATIONS

Extended European Search Report issued in corresponding European Patent Application No. 16002132.5, dated May 10, 2017, 10 pages.

(Continued)

*Primary Examiner* — Louis M Arana
(74) *Attorney, Agent, or Firm* — Quarles & Brady LLP

(57) ABSTRACT

Systems and methods for estimating the actual k-space trajectory implemented when acquiring data with a magnetic resonance imaging ("MRI") system while jointly reconstructing an image from that acquired data are described. An objective function that accounts for deviations between the actual k-space trajectory and a designed k-space trajectory while also accounting for the target image is optimized. To reduce the computational burden of the optimization, a reduced model for the parameters associated with the k-space trajectory deviation and the target image can be implemented.

12 Claims, 3 Drawing Sheets

(56) References Cited

U.S. PATENT DOCUMENTS

| | | |
|---|---|---|
| 2004/0064033 A1* | 4/2004 | Dale .................... G01R 33/565 600/410 |
| 2009/0256570 A1 | 10/2009 | Zelinski et al. |
| 2011/0234227 A1* | 9/2011 | Weiger Senften .......................... G01R 33/4824 324/309 |
| 2013/0099784 A1 | 4/2013 | Setsompop et al. |
| 2014/0314293 A1 | 10/2014 | Dagher et al. |
| 2015/0108984 A1 | 4/2015 | Pfeuffer et al. |

OTHER PUBLICATIONS

Bilgic et al., "Wave-CAIPI for Highly Accelerated 3D Imaging," Magnetic Resonance in Medicine, vol. 73, No. 6, Jul. 1, 2014, pp. 2152-2162, XP055349786.

Cauley et al., "Autocalibrated Wave-CAIPI Reconstruction; Joint Optimization of k-Space Trajectory and Parallel Imaging Reconstruction," Magnetic Resonance in Medicine, Oct. 21, 2016, XP055349317.

Deshmane et al., "Self-calibrated Trajectory Estimation and Signal Correction Method for Robust Radial Imaging Using GRAPPA Operator Gridding (GROG)," Magnetic Resonance in Medicine, vol. 75, No. 2, Mar. 11, 2015 pp. 883-896, XP055349376.

Ianni et al., "Trajectory Auto-Corrected Image Reconstruction," Magnetic Resonance in Medicine, col. 76, No. 3, Sep. 12, 2015, pp. 757-768, XP055349313.

\* cited by examiner

SYSTEMS AND METHODS FOR JOINT TRAJECTORY AND PARALLEL MAGNETIC RESONANCE IMAGING OPTIMIZATION FOR AUTO-CALIBRATED IMAGE RECONSTRUCTION

CROSS-REFERENCE TO RELATED APPLICATIONS

This application claims the benefit of U.S. Provisional Patent Application 62/235,738, filed on Oct. 1, 2015, and entitled "SYSTEMS AND METHODS FOR JOINT TRAJECTORY AND PARALLEL MAGNETIC RESONANCE IMAGING OPTIMIZATION FOR AUTO-CALIBRATED IMAGE RECONSTRUCTION."

STATEMENT REGARDING FEDERALLY SPONSORED RESEARCH

This invention was made with government support under EB017337, EB015896, EB012107, MH093765 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for reconstructing images from data acquired with an MRI system.

Many fast imaging MRI techniques rely on efficient traversal of k-space, including spiral imaging, echo-planar imaging ("EPI"), and Wave-CAIPI. However, due to practical limitations in hardware design these trajectories will often deviate from the theoretical paths specified by the pulse sequence design. To account for these trajectory errors, researchers have utilized a wide range of measurements to both characterize and correct for the discrepancies. For example, navigators are can be continually acquired to account for phase errors between alternating lines in EPI scans. For methods such as spiral imaging and Wave-CAIPI, entire pre-scan measurements can be performed to map the k-space trajectory. These techniques can be time inefficient and in many cases will need to be repeated for different protocols, which will require different trajectories to be mapped.

Thus, there remains a need to provide a method for implementing fast imaging techniques for MRI that are not limited by the scan time associated with acquiring navigator data or the limited utility of fixed trajectory maps.

SUMMARY OF THE INVENTION

The present invention overcomes the aforementioned drawbacks by providing a method for reconstructing an image from data acquired with a magnetic resonance imaging ("MRI") system while jointly estimating an actual k-space trajectory used to sample the data. Data acquired with an MRI system by using a pulse sequence that implements a designed k-space trajectory is provided to a computer system. An image is reconstructed by the computer system from this data by optimizing an objective function that jointly estimates an actual k-space trajectory sampled when acquiring the data and reconstructs the image. The objective function includes at least one term that describes deviations between the actual k-space trajectory and the designed k-space trajectory.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for estimating the actual k-space trajectory implemented when acquiring data with a magnetic resonance imaging ("MRI") system while jointly reconstructing an image from that acquired data. As noted above, practical limitations in hardware design often cause the actual k-space trajectories implemented in a data acquisition to deviate from the theoretical paths specified by the pulse sequence design. The systems and methods described here address this problem by providing a joint k-space trajectory estimation and parallel imaging optimization for auto-calibration image reconstruction.

Figure 2:
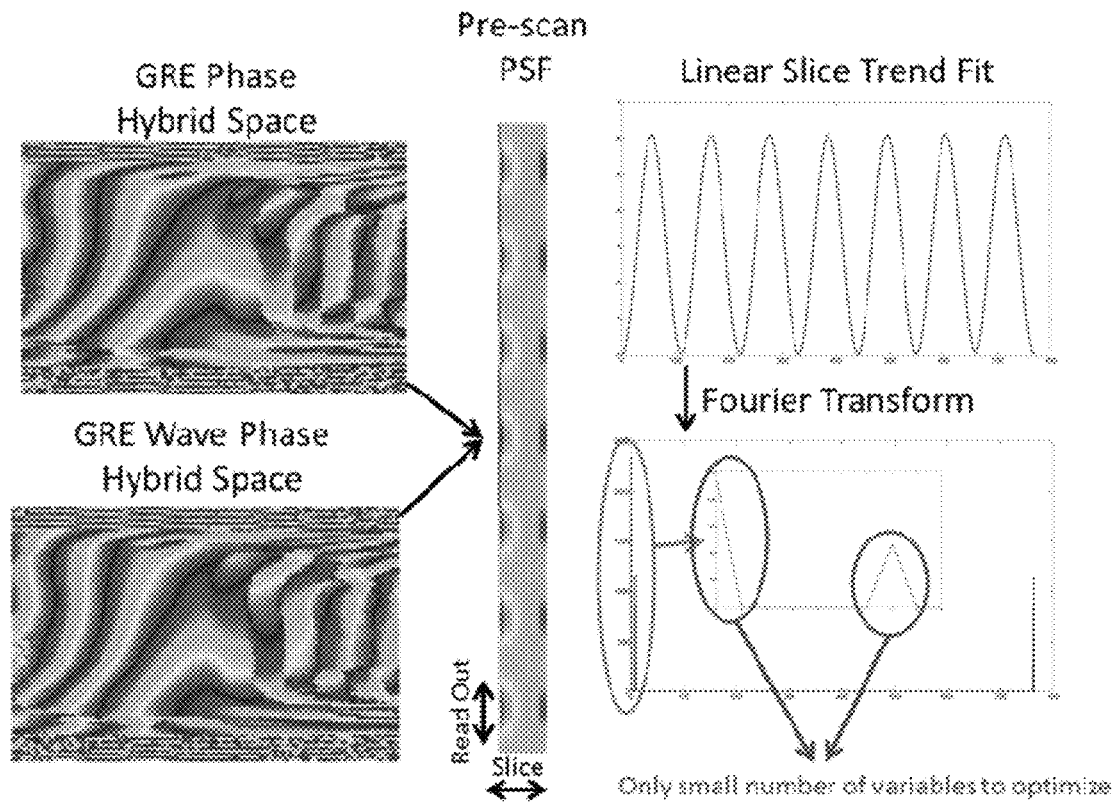
FIG. 2 illustrates the use of a point spread function ("PSF") to account for the phase created through the use of sinusoidal gradients in a Wave-CAIPI method (left). The PSF determined through a pre-scan is typically fitted against the linear trend corresponding to the slice (or phase encode) positions (right). The small numbers of parameters (scaling of Fourier basis terms) that need to be accurately determined are shown.

In one aspect, the systems and methods described here implement reduced models for the estimated k-space trajectories and reconstructed images, which allows for the formulation of a compact joint optimization model. For example, in the case of EPI phase correction errors, only small phase offsets would need to be determined between the even and odd k-space lines. In the case of spiral imaging, the trajectories are primarily described through low-order polynomials or other smooth varying functions (i.e., a small number of polynomial coefficients would become the optimization parameters). As can be seen in FIG. 2, in order to accurately characterize the Wave-CAIPI trajectory only a small number of Fourier coefficients need to be determined.

In order to reduce the number of image reconstruction parameters, the separable (or nearly separable) structure of many parallel imaging formulations is utilized. In the case of Wave-CAIPI or uniform under-sampling, the reconstructions of small subsets of voxels are inherently separable. In the case of random under-sampling (e.g., as used in Compressed Sensing) or spiral imaging, there is locality in the strength of the blurring function, which allows for selective reconstruction of subsets of voxels where low-rank modeling can be used to approximate global effects.

By jointly estimating the actual k-space trajectory, costly pre-scans and navigators are not needed for fast imaging methods. For imaging methods such as the Wave-CAIPI method described in U.S. Pat. No. 8,981,776, which is herein incorporated by reference in its entirety, the joint optimization described here can achieve similar image quality to that of impractical full pre-scan measurement-based reconstructions. The reduced modeling implemented here can also allow for efficient optimization using standard vendor computational resources.

As mentioned above, a joint optimization is used to find the best model parameters that describe the actual k-space trajectory along with the corresponding image to be reconstructed through a parallel imaging formulation. The optimization implemented here simultaneously considers the quality of both the k-space trajectory modeling parameters and the image in order to ensure robust reconstruction.

As an example, in traditional SENSE parallel imaging, the following minimization problem, which accounts for k-space trajectory errors, can be solved:

$$\min_{x,t}\left\{\sum_{i=1}^{N}\|F(t)C_i x - k_i\|_2\right\}; \quad (1)$$

where F(t) is a Fourier operator that describes the k-space trajectory using a mapping to k-space that is a function of adjustment parameters, t; $C_i$, is a parallel receive channel; x is the image to be reconstructed; and $k_i$ is the acquired k-space data.

There are a variety of non-linear least squares techniques that can be utilized to solve the joint problem described by Eqn. (1), including a Levenberg-Marquardt algorithm, trust-regions, a stochastic genetic algorithm, simulated annealing, and a greedy line search. These algorithms can be computationally prohibitive when the number of parameters grows; thus, to address this increasing computational burden, reduced models for the variables t and x can be implemented.

Figure 1:
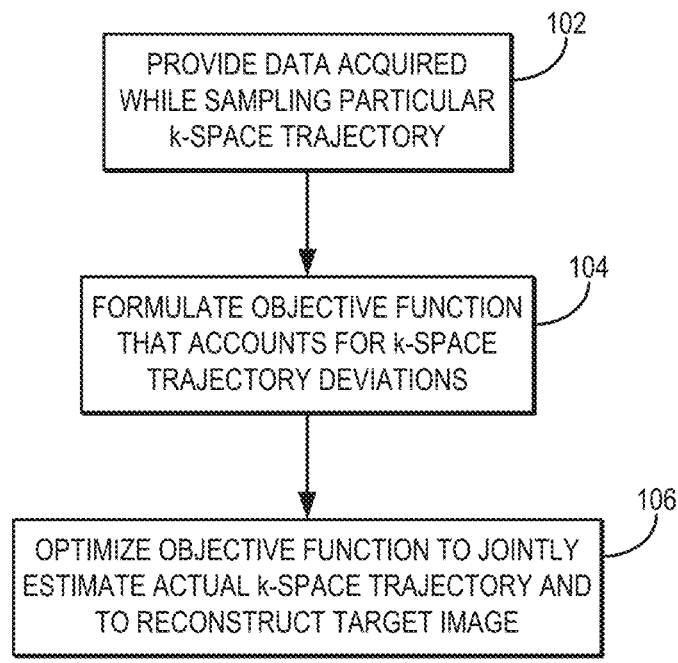
FIG. 1 is a flowchart setting forth the steps of an example method for jointly estimating an actual k-space trajectory and reconstructing a target image from data acquired using a magnetic resonance imaging ("MRI") system.

Referring now to FIG. 1, a flowchart is illustrated as setting forth the steps of an example method for jointly estimating an actual k-space trajectory and reconstructing an image from data acquired while sampling k-space along the actual k-space trajectory. Data acquired with an MRI system are provided to a computer system for processing and image reconstruction, as indicated at step 102. In one example, the acquired data can be provided to the computer system by retrieving previously acquired data from a data storage. In another example, the data can be provided to the computer system by acquiring the data with an MRI system. In any event, the acquired data includes data acquired while sampling k-space along a particular k-space trajectory. One example of a k-space trajectory that can be implemented is the Wave-CAIPI k-space trajectory referenced above.

An objective function is formulated next, as indicated at step 104. The objective function includes one or more terms that account for deviations in the actual k-space trajectory relative to the k-space trajectory prescribed by the pulse sequence used to acquire the data provided in step 102. The objective function also includes one or more terms that correspond to the target image to be reconstructed from the provided data. As one example, the objective function can include the following function:

$$\sum_{i=1}^{N}\|F(t)C_i x - k_i\|_2; \quad (2)$$

where F(t) describes the k-space trajectory using a mapping to k-space that is a function of adjustment parameters, t; $C_i$ is the $i^{th}$ parallel receive channel in an array of radio frequency ("RF") receive coils; x is the target image to be reconstructed; and $k_i$ is the k-space data acquired by the $i^{th}$ receive channel.

The objective function formulated in step 104 is then optimized to jointly estimate the actual k-space trajectory used to acquire the provided data and to reconstruct the target image, as indicated at step 106. Preferably, the optimization implements a reduced model for the parameters, t and x, to improve the computational efficiency of the optimization problem.

As one example, consider a Wave-CAIPI pulse sequence, which would typically use a pre-scan in order to determine the phase applied by sinusoidal gradients. FIG. 2 illustrates the use of a pre-scan to create a point spread function ("PSF") to represent the phase differences observed between a full gradient-recalled echo ("GRE") scan and an identical scan with the Wave-CAIPI gradients applied. It is important to note that the observed PSF will be dependent on many protocol parameters and the associated pre-scans would need to be repeated based upon changes to these protocol parameters. The measured PSF in this example is then typically fitted based upon the linear trend associated with the slice (or phase encode) positions. As can be seen in FIG. 2, only a small number of Fourier coefficients are required to accurately capture the Wave-CAIPI PSF. In the case of the clinically relevant protocol of 1 mm isotropic resolution, 256×192×120 $mm^3$ image matrix, and R=3×3 acceleration, the parameter t can be reduced from 1536×192×120=35,389,440 possible parameters (i.e., one parameter for each k-space location in the typical six-times over-sampled FOV) to only 14 independent degrees of freedom.

Thus, to allow for efficient optimization of the parameters, model reduction of the parallel imaging reconstruction can be implemented. For instance, in the case of Wave-CAIPI, the reconstruction quality across only small subsets of voxels can be analyzed. The computational cost of this operation is much smaller than a complete parallel imaging reconstruction, thereby facilitating efficient optimization of the k-space trajectory parameters. Similar model reduction techniques can be applied to imaging applications that use other k-space trajectories, such as spiral imaging and echo-planar imaging ("EPI").

Figure 3:
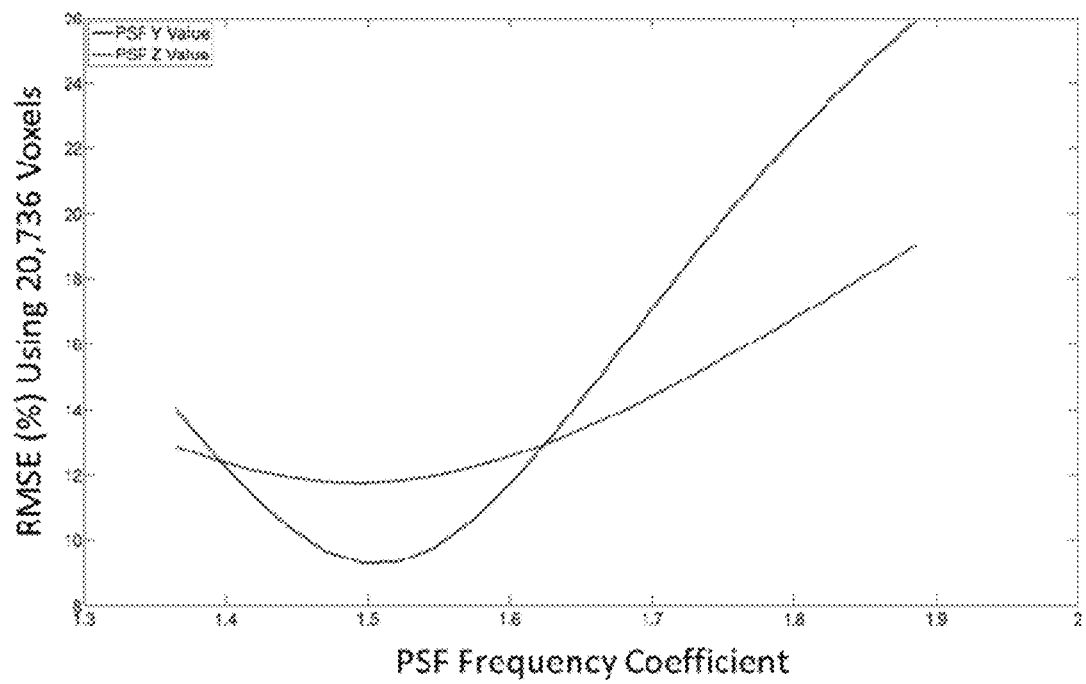
FIG. 3 is a plot illustrating change in RMSE across a limited number of voxels as the Fourier coefficients used to describe the Wave-CAIPI PSF are manipulated.

FIG. 3 shows the change in parallel imaging RMSE across 20,736 voxels as the Fourier coefficients used to describe the Wave-CAIPI PSF are manipulated. Local minimums are present near the theoretical values. In addition, the deviation in RMSE is extremely smooth, which allows for efficient optimization to arrive at a minimum.

Figure 4:
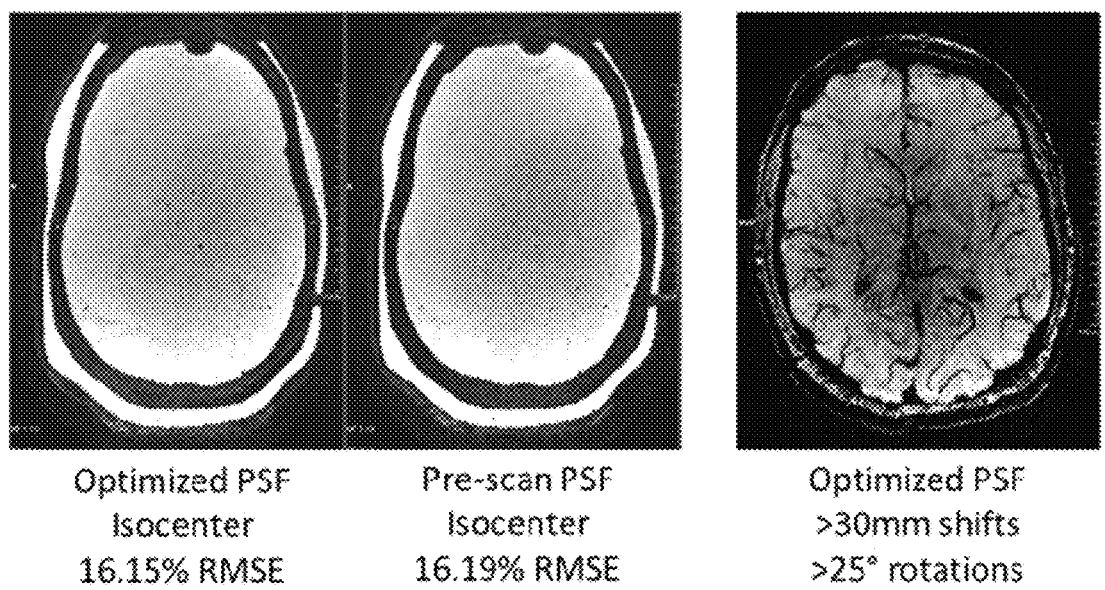
FIG. 4 depicts a phantom reconstruction comparison of using a full pre-scan method and an optimized PSF at isocenter (left, middle). In vivo images from a healthy volunteer utilizing an optimized PSF and clinically relevant FOV translations and rotations is depicted in the right panel.

As a demonstration of both the accuracy and computational efficiency of the techniques described here, a greedy "shooting" method that sequentially optimizes each variable through a golden section search can be implemented. Several passes of the method can be performed in order to resolve interdependencies between the variables being optimized. FIG. 4 shows results from a uniform brain phantom imaged at isocenter on a 3 T MRI system. The joint optimization described here achieved 16.15% mean RMSE, which is below the full pre-scan approach, which had 16.19% RMSE. FIG. 4 also shows in vivo results from a healthy volunteer using standard translations (about 30 mm) and rotations (about 25 degrees) of the FOV.

For these cases, the PSF was automatically determined in under a minute using only three CPU cores on standard vendor computational hardware. Through the use of additional parallel computing resources (commonly available on modern scanners), it is contemplated that this computational time will only be a small fraction of the time required for a typical parallel imaging reconstruction.

Figure 5:
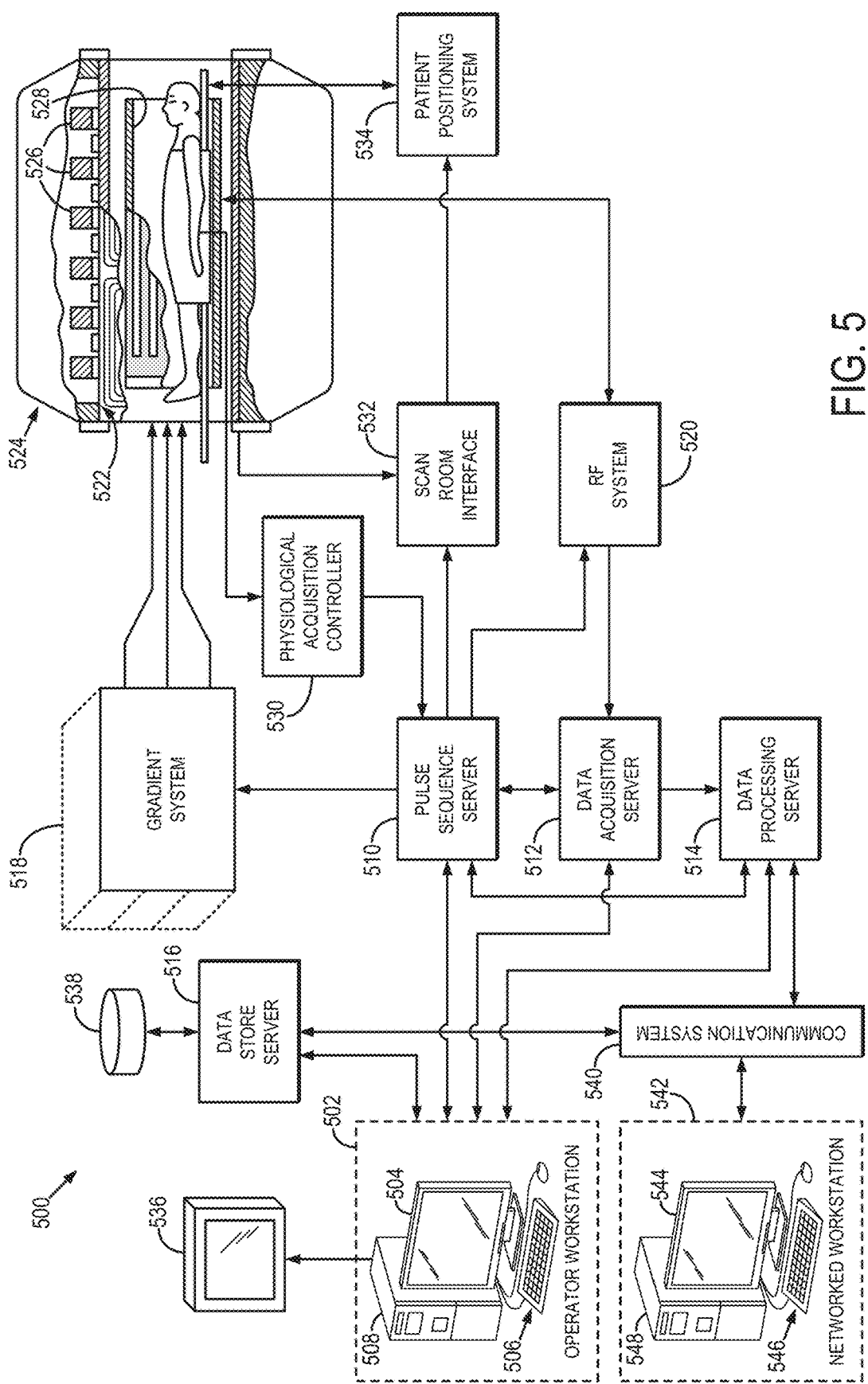
FIG. 5 is a block diagram of an example MRI system.

Referring particularly now to FIG. 5, an example of a magnetic resonance imaging ("MRI") system 500 is illustrated. The MRI system 500 includes an operator workstation 502, which will typically include a display 504; one or more input devices 506, such as a keyboard and mouse; and a processor 508. The processor 508 may include a commercially available programmable machine running a commercially available operating system. The operator workstation 502 provides the operator interface that enables scan prescriptions to be entered into the MRI system 500. In general, the operator workstation 502 may be coupled to four servers: a pulse sequence server 510; a data acquisition server 512; a data processing server 514; and a data store server 516. The operator workstation 502 and each server 510, 512, 514, and 516 are connected to communicate with each other. For example, the servers 510, 512, 514, and 516 may be connected via a communication system 540, which may include any suitable network connection, whether wired, wireless, or a combination of both. As an example, the communication system 540 may include both proprietary or dedicated networks, as well as open networks, such as the internet.

The pulse sequence server 510 functions in response to instructions downloaded from the operator workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil (not shown in FIG. 5), in order to perform the prescribed magnetic resonance pulse sequence. Responsive magnetic resonance signals detected by the RF coil 528, or a separate local coil (not shown in FIG. 5), are received by the RF system 520, where they are amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the scan prescription and direction from the pulse sequence server 510 to produce RF pulses of the desired frequency, phase, and pulse amplitude waveform. The generated RF pulses may be applied to the whole-body RF coil 528 or to one or more local coils or coil arrays (not shown in FIG. 5).

The RF system 520 also includes one or more RF receiver channels. Each RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (3);$$

and the phase of the received magnetic resonance signal may also be determined according to the following relationship:

$$\varphi = \tan^{-1}\left(\frac{Q}{I}\right). \quad (4)$$

The pulse sequence server 510 also optionally receives patient data from a physiological acquisition controller 530. By way of example, the physiological acquisition controller 530 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, such that no data is lost by data overrun. In some scans, the data acquisition server 512 does little more than pass the acquired magnetic resonance data to the data processor server 514. However, in scans that require information derived from acquired magnetic resonance data to control the further performance of the scan, the data acquisition server 512 is programmed to produce such information and convey it to the pulse sequence server 510. For example, during prescans, magnetic resonance data is acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also be employed to process magnetic resonance signals used to detect the arrival of a contrast agent in a magnetic resonance angiography ("MRA") scan. By way of example, the data acquisition server 512 acquires magnetic resonance data and processes it in real-time to produce information that is used to control the scan.

The data processing server 514 receives magnetic resonance data from the data acquisition server 512 and processes it in accordance with instructions downloaded from the operator workstation 502. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 514 are conveyed back to the operator workstation 502 where they are stored. Real-time images are stored in a data base memory cache (not shown in FIG. 5), from which they may be output to operator display 502 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the operator workstation 502. The operator workstation 502 may be used by an operator to archive the images, produce films, or send the images via a network to other facilities.

The MRI system 500 may also include one or more networked workstations 542. By way of example, a networked workstation 542 may include a display 544; one or more input devices 546, such as a keyboard and mouse; and a processor 548. The networked workstation 542 may be located within the same facility as the operator workstation 502, or in a different facility, such as a different healthcare institution or clinic.

The networked workstation 542, whether within the same facility or in a different facility as the operator workstation 502, may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing an image from data acquired with a magnetic resonance imaging (MRI) system while jointly estimating an actual k-space trajectory used to sample the data, the steps of the method comprising:
   (a) providing to a computer system, data acquired with an MRI system by using a pulse sequence that implements a designed k-space trajectory;
   (b) reconstructing an image from the data provided in step (a) by using the computer system to optimize an objective function that jointly reconstructs the image and estimates an actual k-space trajectory sampled when acquiring the data provided in step (a), wherein the objective function includes at least one term that describes deviations between the actual k-space trajectory and the designed k-space trajectory.

2. The method as recited in claim 1, wherein the objective function models the deviations between the actual k-space trajectory and the designed k-space trajectory based on adjustment parameters.

3. The method as recited in claim 2, wherein optimizing the objective function includes forming a reduced model for the adjustment parameters and the image.

4. The method as recited in claim 3, wherein the reduced model for the image includes evaluating reconstruction quality across a subset of voxels in the image while reconstructing the image.

5. The method as recited in claim 3, wherein the reduced model for the adjustment parameters includes reducing a number of adjustment parameters to be evaluated while estimating the actual k-space trajectory sampled when acquiring the data provided in step (a).

6. The method as recited in claim 2, wherein the designed k-space trajectory is an echo-planar imaging (EPI) trajectory and the adjustment parameters include phase offsets.

7. The method as recited in claim 4, wherein the phase offsets are phase offsets determined between even and off k-space lines in the EPI trajectory.

8. The method as recited in claim 2, wherein the designed k-space trajectory is a spiral trajectory and the adjustment parameters include polynomial coefficients.

9. The method as recited in claim 2, wherein the adjustment parameters include Fourier coefficients.

10. The method as recited in claim 1, wherein the objective function is, $$\sum_{i=1}^{N} \|F(t)C_i x - k_i\|_2$$

wherein $F(t)$ is a function that describes the actual k-space trajectory using a mapping to k-space that is a function of adjustment parameters, t; $C_i$ is an $i^{th}$ receive channel in an array of N radio frequency ("RF") receive coils; x is the image to be reconstructed; and $k_i$ is data acquired by the $i^{th}$ receive channel.

11. The method as recited in claim 10, wherein optimizing the objective function includes forming a reduced model for the adjustment parameters, t, and the image, x.

12. The method as recited in claim 1, wherein step (a) includes acquiring the data with the MRI system using the designed k-space trajectory as an input.

* * * * *